United States Patent [19]

Yamamoto et al.

[11] Patent Number: 4,905,037
[45] Date of Patent: Feb. 27, 1990

[54] IMAGE TRANSFER SYSTEM

[75] Inventors: Takemi Yamamoto; Jun Sakai, both of Nagoya, Japan

[73] Assignee: Brother Kogyo Kabushiki Kaisha, Aichi, Japan

[21] Appl. No.: 22,956

[22] Filed: Mar. 6, 1987

[30] Foreign Application Priority Data

Mar. 13, 1986 [JP] Japan .................. 61-55366

[51] Int. Cl.⁴ .................. G03B 27/32; G03B 27/52
[52] U.S. Cl. .................. 355/27; 355/67; 355/68; 355/71; 307/427; 430/138
[58] Field of Search .................. 355/27, 67, 68, 71, 355/32, 35, 38; 307/427; 430/138

[56] References Cited

U.S. PATENT DOCUMENTS

| | | | |
|---|---|---|---|
| 3,934,154 | 1/1976 | Cook | 307/427 |
| 4,002,830 | 1/1977 | Brown et al. | 350/6.8 |
| 4,199,698 | 4/1980 | Bethea et al. | 307/427 |
| 4,272,694 | 6/1981 | Jacobs | 307/427 |
| 4,367,946 | 1/1983 | Varner | 355/1 |
| 4,376,899 | 3/1983 | Chemla et al. | 307/427 |
| 4,505,569 | 3/1985 | Seto et al. | 307/427 |
| 4,624,560 | 11/1986 | Beery | 355/27 |
| 4,672,014 | 6/1987 | Joiner et al. | 430/138 |
| 4,742,374 | 5/1988 | Yamamoto et al. | |

FOREIGN PATENT DOCUMENTS 0066053 8/1982 European Pat. Off. .
129662 6/1986 Japan .

Primary Examiner—Monroe H. Hayes
Attorney, Agent, or Firm—Oliff & Berridge

[57] ABSTRACT

An optical image transfer system for transferring images to a photosensitive medium, which has a light source for generating a radiation having a first wavelength, and a wavelength converter disposed in a light path between the light source and the photosensitive medium, for converting the first wavelength of the radiation generated by the light source, to a second wavelength which is shorter than the first wavelength and to which the photosensitive medium is sensitive. The wavelength converter may be used in a system wherein images are transferred to a color-imaging photosensitive medium.

10 Claims, 7 Drawing Sheets

IMAGE TRANSFER SYSTEM

BACKGROUND OF THE INVENTION

1. Field of the Invention

The present invention relates in general to an optical image transfer system, and more particularly to a technique that permits the use of a simple, small-sized light source for the image transfer system.

2. Discussion of the Prior Art

There is known an image transfer system of a type wherein images are formed on a photosensitive medium by exposure of the medium to a radiation. For example, such a photosensitive medium consists of a substrate, a developer layer formed on the substrate, and a layer consisting of a multiplicity of microcapsules that are formed on or embedded in the developer layer. Each microcapsule includes a radiation-curable photosensitive resin, a normally colorless chromogenic material (color former which becomes a dye) which reacts with the developer layer to form a visible image spot, and a photoinitiator for promoting polymerization of the chromogenic material. Upon exposure of the photosensitive medium to a radiation, the radiation-curable resin of the microcapsules in exposed areas of the medium is polymerized and thus hardened to an extent corresponding to an amount of exposure to the radiation. On the other hand, the radiation-curable resin of the microcapsules in unexposed or insufficiently exposed areas of the medium remain uncured or are insufficiently cured. The microcapsules in the uncured or insufficiently cured areas are ruptured in a subsequent developing process wherein the photosensitive medium is pressed, heated or subjected to a chemical treatment. As a result, the chromogenic materials come out of the ruptured microcapsules and react with the developer layer, producing visible image spots on the photosensitive medium, according to the amounts of the chromogenic materials which have reacted with the developer layer.

PROBLEMS SOLVED BY THE INVENTION

Up to the present, there have been available no such photosensitive resins that are sensitive to lights having wavelengths that are longer than the wavelengths corresponding to blue portions of the visible spectrum of light. Therefore, the wavelengths of lights emitted by a light source to expose a photosensitive medium must be shorter than the wavelengths corresponding to the blue portions of the visible spectrum. In particular, a light source producing ultraviolet rays is used. Generally, mercury lamps and xenon lamps are considered as light sources emitting such short-wavelength lights. However, these lamps are expensive, and require a large-sized power supply. Further, an image transfer system equipped with a light source that emits ultraviolet rays requires expensive optical elements which are adapted to the ultraviolet rays. Thus, the image transfer systems presently available are relatively large in size and expensive.

SUMMARY OF THE INVENTION

It is accordingly an object of the present invention to provide an improved image transfer system capable of forming images on a photosensitive medium, which uses a comparatively simple, small-sized and inexpensive light source for exposing the photosensitive medium, and which is compact in construction and is available at a reduced cost.

According to the present invention, there is provided an image transfer system for transferring images to a photosensitive medium, including a light source for generating a radiation having a first wavelength, and a wavelength converter disposed in a light path between the light source and the photosensitive medium. The wavelength converter is operable for converting the first wavelength of the radiation generated by the light source, to a second wavelength which is shorter than the first wavelength and to which the photosensitive medium is sensitive. The wavelength converter may be either of a transmission type or of a reflection type. In the transmission type, a radiation having the shorter or second wavelength is provided as a result of transmission of the radiation having the first wavelength through the wavelength converter. In the reflection type, the radiation having the second wavelength is provided as light reflected by the wavelength converter.

In the image transfer system of the present invention constructed as described above, the wavelength of the radiation emitted by the light source is shortened by the wavelength converter disposed in the light path between the light source and the photosensitive medium. Accordingly, the instant image transfer system may use a light source which generates a radiation having a relatively long wavelength, i.e., a radiation in the visible spectrum. In other words, the instant image transfer system does not require a mercury or xenon lamp as a light source. Therefore, a power supply device to drive the light source of the present system can be made small and inexpensive. Further, the system can employ commonly used, relatively inexpensive optical components adapted to the visible rays of light. Thus, the image transfer system as a whole can be small-sized and is available at a reduced cost, as compared with a conventional system wherein the photosensitive medium is exposed to a short-wavelength radiation generated by a light source.

Preferably, the photosensitive medium used in the present image transfer system is a photosensitive paper which contains a layer of microcapsules each of which includes a radiation-curable resin which is polymerized and hardened upon exposure to a radiation. Since the radiation-curable resin of the microcapsules in unexposed areas of this photosensitive paper remain uncured, the microcapsules in the unexposed areas are ruptured upon exposure to a pressure, friction or heat in a developing process. Consequently, normally colorless chromogenic materials contained in the microcapsules come out and react with a developer layer adjacent to the microcapsule layer, thereby forming a visible image on the photosensitive paper. This type of photosensitive paper is referred to as "self-activated" type. In the case where the photosensitive or radiation-curable resin of the photosensitive paper is cured upon exposure to a radiation, the images reproduced on the paper are not reversed with respect to the images on the original. However, if the photosensitive paper has microcapsules whose resin is softened or becomes brittle upon exposure to a radiation, the reproduced images on the photosensitive paper are reversed with respect to the images on the original. In the latter case, the photosensitive resin may consist of 3-oximino-2-butanone methacrylate which undergoes main chain scission upon light exposure, or poly 4'-alkyl acylo-phenones.

According to another advantageous feature of the invention, the wavelength converter is formed of an SHD crystal such as $KH_2PO_4$ (KDP), $NH_4H_2PO_4$, $KD_2PO_4$, $ND_4D_2PO_4$, $KH_2AsO_4$, $LiIO_3$, $LiClO_4.3H_2O$. In this case, the SHD crystal generates a second harmonic of an incident radiation (radiation generated by the light source), as a result of passage of the incident radiation through the crystal.

BRIEF DESCRIPTION OF THE DRAWINGS

The above and other objects, features and advantages of the present invention will become more apparent by reading the following detailed description of preferred embodiments of the invention, when considered in connection with the accompanying drawings, in which.

DETAILED DESCRIPTION OF THE PREFERRED EMBODIMENTS

Figure 1:
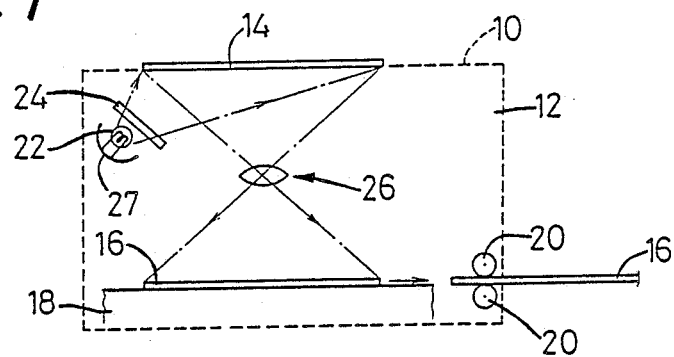
FIG. 1 is a schematic view of one embodiment of an image transfer system of the present invention.

Referring first to a schematic view of FIG. 1, there is shown an image transfer system wherein a darkroom 12 is defined within a housing 10. An original 14 having images to be transferred to a photosensitive paper 16 is supported on a glass plate (not shown). The photosensitive paper 16 is continuously fed on a support 18 parallel to the glass plate, by a plurality of pairs of feed rollers (not shown), and is passed through a pressure nip between a pair of pressure rollers 20, 20. These pressure rollers serve as a developing device, as described below. A light source lamp 22 in the form of a bar is disposed within the housing 10, such that the bar extends parallel to a straight line which is parallel to the original 14 and photosensitive paper 16 and perpendicular to the direction of feed of the paper 16. The bar-like lamp 22 is adapted to irradiate the lower surface of the original 14 which bears the images. Between the bar-like lamp 22 and the original 14, there is provided a wavelength converting filter 24 which functions to convert the wavelength of a radiation generated by the lamp 22, to a shorter wavelength that falls within a band to which the photosensitive paper 16 is sensitive. Namely, the radiation incident upon the filter 24 is converted into a light having a wavelength shorter than that of the incident light. This transmission type wavelength converter 24 may be an SHD crystal plate, for example, which generates a second harmonic of the incident radiation which strikes the crystal. Preferably, the SHD crystal is selected from the group of materials previously indicated. The light which has passed through the wavelength converting filter 24 is reflected by the lower surface of the original 14. The reflected light is focused on the photosensitive paper 16 by means of an optical focusing device 26 disposed between the original 14 and the photosensitive paper 16. The focusing device 26 includes convex lens. Reference numeral 27 designates a reflector which extends along the bar-like lamp 22 and which is C-shaped in the transverse cross section.

Figure 2:
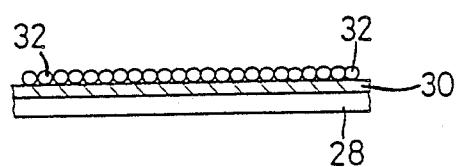
FIG. 2 is an illustration of a photosensitive paper used in the image transfer system of FIG. 1.

An example of the photosensitive paper 18 used in the present embodiment as a photosensitive recording medium, is disclosed, for example, in Laid-Open Publication Nos. 58-23024 and 58-23025 (laid open in 1983) of Japanese Patent Applications. Described more specifically referring to FIG. 2, the photosensitive paper 18 consists of a substrate 28, a developer layer 30 formed on the substrate, and a layer of microcapsules 32 formed on the developer layer 30. Each microcapsule 32 includes a radiation-curable resin, and a normally colorless chromogenic material which reacts with the developer layer 30. The microcapsule 32 is covered with an outer coating, as needed.

Latent images corresponding to the images on the original 14 are formed on the photosensitive paper 16, due to exposure of the paper 16 to the radiation which is reflected by the original 14 and focused by the optical focusing device 26. That is, the microcapsules 32 are image-wise selectively exposed to the reflected radiation, and are consequently cured or hardened. While the hardened microcapsules 32 are not ruptured by the developing pressure rollers 20, the unexposed or insufficiently exposed microcapsules 32 are ruptured to an extent corresponding to the amount of exposure, whereby the chromogenic materials come out of the ruptured microcapsules 32 in an amount corresponding to the degree of rupture. As a result, the chromogenic materials react with the developer layer 30, forming visible image spots whose density is proportional to the amount of exposure of the microcapsules 32 to the reflected radiation. Thus, the latent images on the exposed photosensitive paper 16 are developed into visible images.

In operation of the present image transfer system, the wavelength of a radiation produced by the lamp 22 is converted by the converting filter 24 to a shorter wavelength. Hence, the system requires neither an expensive light source such as a mercury lamp or a xenon lamp, nor a large-sized, expensive power supply device for the light source. Instead, the system simply requires an incandescent or fluorescent lamp, or other comparatively inexpensive lamps which produce a radiation in the visible spectrum. Further, the optical focusing device 26 of the present image transfer system does not require optical elements which are specially adapted for ultraviolet rays that are conventionally used. Thus, the system as a whole can be made compact and available at a relatively low cost.

Various other embodiments of the invention will be described, by reference to FIG. 3 and the following figures. In the interest of brevity and simplification, the same reference numerals as used in the preceding embodiment of FIGS. 1 and 2 will be used to identify the functionally corresponding elements, and redundant descriptions of these elements will not be provided.

Figure 3:
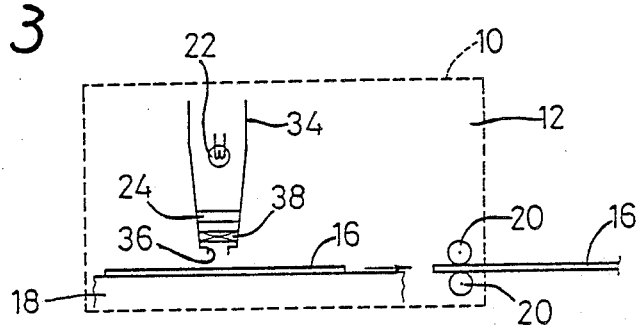
FIGS. 3 through 9 are views showing other embodiments of the present invention.

In a first modified embodiment of FIG. 3, the bar-like lamp 22 is disposed above the support 18 and enclosed in a shielding hood 34. The lamp 22 extends parallel to the photosensitive paper 16 and perpendicular to the direction of movement between the lamp 22 and the paper 16. The bottom of the hood 34 facing the support 18 has a plurality of apertures 36 which are spaced from each other in the direction of extension of the bar-like lamp 22. These apertures 36 are provided to irradiate corresponding small local areas of the photosensitive paper 16 with the radiation emitted by the lamp 22. Above these apertures 36, there is disposed a shutter array 38 which consists of a plurality of shutters aligned with the respective apertures. These shutters are selectively opened to pass the radiation therethrough the corresponding apertures 36. The shutter array 38 usually consists of a liquid crystal shutter having a plurality of shutter portions which are arranged in a row parallel to the lamp 22. The shutter portions are selectively opened according to image signals which represent images to be transferred to the photosensitive paper 16. The wavelength converting filter 24 is disposed between the light source lamp 22 and the shutter array 38, for the same purpose as described above.

In the present embodiment, the shutters or shutter portions of the shutter array 38 are selectively opened while the photosensitive paper 16 is advanced, whereby the photosensitive paper 16 is locally image-wise exposed to the radiation. Thus, latent images are formed on the photosensitive paper 16. The latent images are developed into visible images while the paper 16 is passed through the pressure nip between the developing pressure rollers 20. The images formed consist of picture elements corresponding to the apertures 36 through which the radiation has passed. In the instant arrangement, too, the wavelength of the radiation emitted by the lamp 22 is converted by the converting filter 24 to a shorter wavelength. Thus, the same advantages as indicated above in connection with the preceding embodiment are offered.

Figure 4:
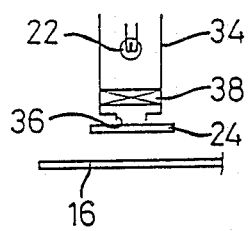
Figure 5:
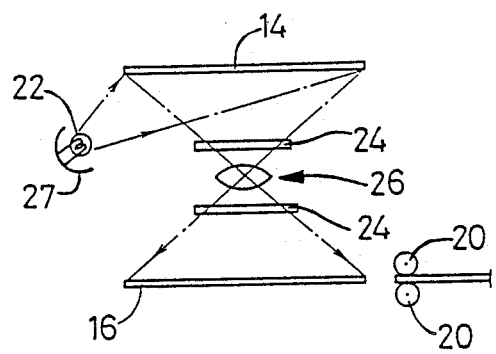
Figure 6:
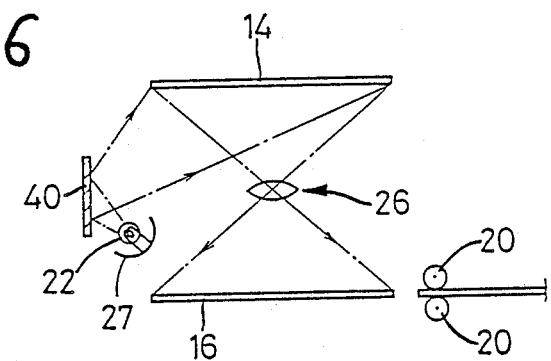

The wavelength converting filter 24 may be disposed between the photosensitive paper 16 and the shutter array 38 (apertures 36 of the hood 34), as depicted in FIG. 4. Further, the two converting filters 24 may be provided as shown in FIG. 5. Namely, one filter 24 is disposed between the original 14 and the focusing device 26, and the other is between the focusing device 26 and the photosensitive paper 16. Alternatively, the single filter 24 may be disposed at one of the above two positions in the light path. In the arrangement of FIG. 5, the radiation reflected by the original 14 is transmitted through the two converting filters 24, 24, before it is incident upon the photosensitive paper 16. If each filter 24 is capable of reducing a wavelength $\lambda$ of the radiation to $\lambda/2$, the wavelength of a radiation incident upon the photosensitive paper 16 is equal to $\lambda/4$. It will be obvious that three or more wavelength converting filters may be used as needed, to obtain a wavelength to which the photosensitive paper 16 is sensitive.

Figure 7:
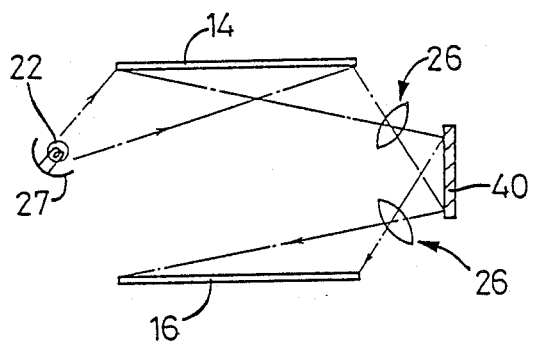
Figure 8:
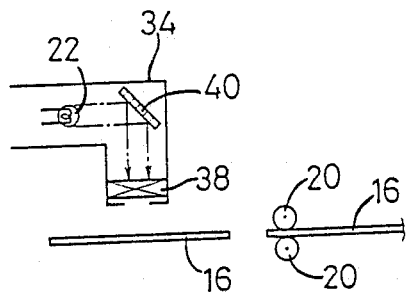
Figure 9:
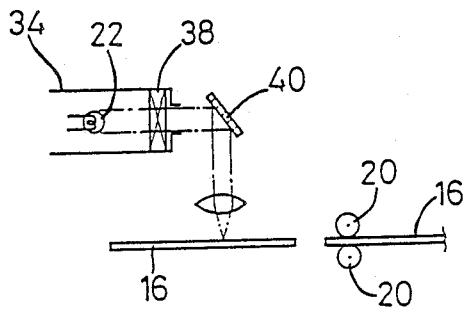

While the wavelength converter in the form of the wavelength converting filter 24 used in the described embodiments is of a transmission type (wherein a radiation is passed through the converter), it is possible to use a reflection type of wavelength converter as indicated at 40 in FIGS. 6 through 9, for obtaining the same results as provided by the filter 24. This wavelength converter element 40 is disposed to reflect a radiation such that the wavelength of the reflected radiation is shorter than that of the incident radiation. The converter element 40 is located at a suitable position in the light path between the light source lamp 22 and the photosensitive paper 16. For example, the converter element 40 consists of a fluorescent body made of a phosphate compound. The wavelength of the radiation reflected by the converter element 16 may be suitably selected by changing the material of the fluorescent body. In the embodiment of FIG. 7, the reflected radiation from the original 14 is focused on the reflection type converter element 40, by one of two focusing devices 26, 26 which is located between the original 14 and the converter element 40. The radiation reflected by the converter element 40, which has a shorter wavelength than the incident radiation, is passed through the other focusing device 26, and is thus focused on the photosensitive paper 16.

The concept of the present invention may be embodied as an image transfer system for color imaging. That is, a wavelength converter of a transmission or reflection type is used in these color-imaging systems, to provide the same advantages as enjoyed in the above-described embodiments.

Figure 10:
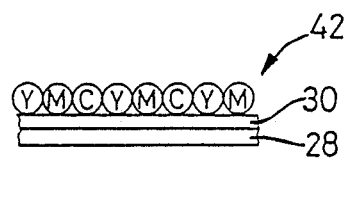
FIG. 10 is an illustration of a positive type photosensitive paper for color-imaging.
Figure 11:
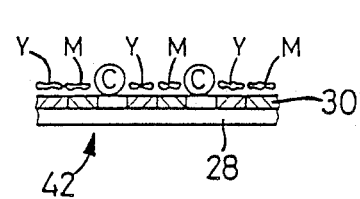
FIGS. 11 through 13 are views illustrating three states of color developments on the photosensitive paper of FIG. 10.
Figure 12:
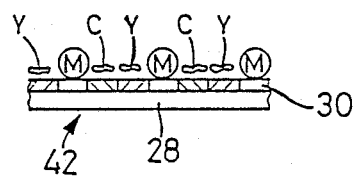
Figure 13:
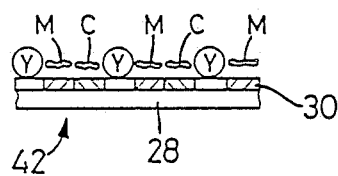

Referring to FIG. 10, there will first be described a positive type color-imaging photosensitive paper 42 used in the color-image transfer system according to the invention. This photosensitive paper 42 has three types of microcapsules distributed in a mixed condition, for example, microcapsules C curable by a ultraviolet radiation having a wavelength $\lambda C$ of about 340 nm, microcapsules M curable by a ultraviolet radiation having a wavelength $\lambda M$ of about 385 nm, and microcapsules Y curable by a ultraviolet radiation having a wavelength $\lambda Y$ of about 470 nm. Each of the microcapsules C contains a normally colorless chromogenic material which produces a cyan color upon reaction with the developer layer 30. Similarly, the microcapsules M and Y contain normally colorless chromogenic materials which produce magenta and yellow colors, respectively, upon reaction with the developer layer 30. Accordingly, when the photosensitive paper 48 is locally exposed to the radiation with the wavelength $\lambda C$, only the microcapsules C in the exposed area are cured, and the microcapsules M and Y in the same exposed area are ruptured to produce the magenta and yellow colors in the developing process, as indicated in FIG. 11, whereby a reddish color is produced. Similarly, the microcapsules M in an area of the photosensitive paper 48 exposed to the radiation having the wavelength $\lambda M$ are cured, and the microcapsules C and Y in that exposed area are ruptured to produce the cyan and yellow colors in the developing process, as indicated in FIG. 12, whereby a greenish color is produced. Likewise, the microcapsules Y are cured, and the microcapsules C and M are ruptured to produce the cyan and magenta colors, as indicated in FIG. 12, eventually forming a bluish color, if these microcapsules are exposed to the radiation having the wavelength $\lambda Y$.

Figure 14:
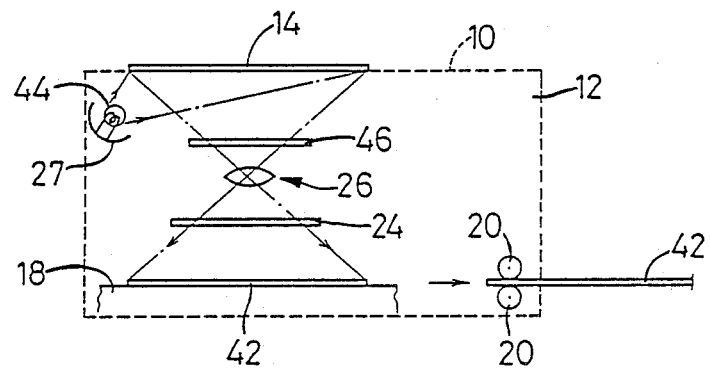
FIGS. 14 and FIGS. 15–16 are views showing other embodiments of an image transfer system for color-imaging according to the invention.

Referring next to FIG. 14, there is shown a color-imaging system using a bar-like lamp 44 which is adapted to produce radiations having wavelength bands corresponding to red, green and blue portions of the visible spectrum of lights. The radiation emitted by the lamp 44 is reflected by the lower surface of the original 14. The reflected radiation is incident upon a color filter device 46 equipped with three filters (not shown), red-color filter, green-color filter and blue-color filter which are selectively activated to select the corresponding red, green and blue wavelength bands. When the red-color filter is activated, only the red-band radiation is permitted to pass through the color filter device 46, and is incident upon the wavelength converting filter 24 via the focusing device 26. The wavelength of the incident light is converted by the converting filter 24 to the shorter wavelength C corresponding to the reddish color. Thus, the photosensitive paper 42 is exposed to the radiation with the wavelength $\lambda C$, whereby only the microcapsules C are hardened. Then, the green-color filter is activated, and only the green-band radiation is transmitted through the color filter device 46, and the wavelength of the radiation is shortened by the filter 24 to the wavelength $\lambda M$ corresponding to the greenish color. Thus, the paper 42 is exposed to the radiation with the wavelength $\lambda M$, and only the microcapsules M are hardened. Subsequently, the blue-color filter of the filter device 46 is selected, to permit only the blue-band radiation to be incident upon the wavelength converting filter 24, whereby the photosensitive paper 42 is exposed to the radiation with the wavelength $\lambda Y$ corresponding to the bluish color. Thus, only the microcapsules Y are hardened. The photosensitive paper 42 thus exposed to the radiations with the different wavelengths is developed by the pressure rollers 20, such that the areas exposed to the wavelength $\lambda C$ are given reddish colors, while the areas exposed to the wavelengths M and Y are given greenish and bluish colors, respectively. In this manner, the color images on the original 14 are transferred to the color-imaging photosensitive paper 42. The wavelength converting filter 24 may have three filter portions which have different filtering characteristics for efficient conversion of the wavelengths of the radiations from the single light source 44, to the respective wavelengths $\lambda C$, $\lambda M$ and $\lambda Y$. Like the filters of the color filter device 46, these three filter portions are sequentially selected. In the case where the wavelength converting filter 24 is formed of an SHD crystal which converts the wavelengths in all three bands of the incident light rays to shorter wavelengths, the color filter device 46 may be eliminated. In this case, the photosensitive paper 42 is exposed at one time to the wavelengths $\lambda C$, $\lambda M$ and $\lambda Y$.

Figure 15:
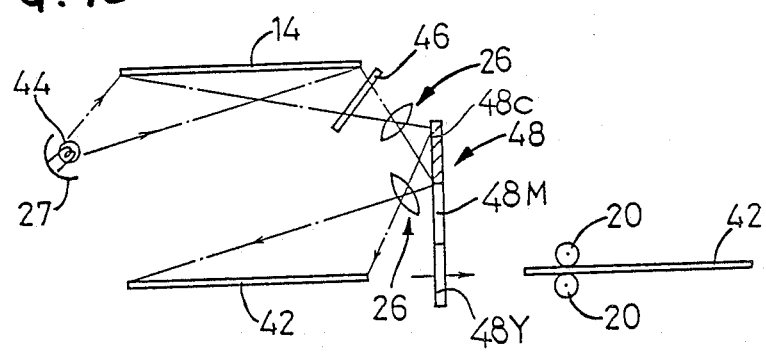
Figure 16:
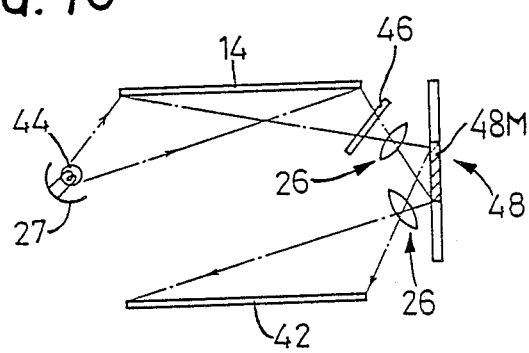

FIGS. 15 and 16 show color-image transfer systems using a wavelength converter device 48 of a reflection type. The converter device 48 has three converter elements 48C, 48M and 48Y formed of a phosphate compound. These three converter elements 48C, 48M and 48Y are selectively used and have different characteristics for converting the wavelengths of the incident red-band, green-band and blue-band radiations to the wavelengths $\lambda C$, $\lambda M$ and $\lambda Y$, respectively. When the red-color filter of the color filter device 46 is selected, the converter element 48C of the converter device 48 is selected, as indicated in FIG. 15. Similarly, when the green-color filter of the color filter device 46 is selected, the converter element 48M of the converter device 48 is selected as indicated in FIG. 16. Further, the converter element 48Y is selected when the blue-color filter of the color filter device 46 is selected. As in the embodiment of FIG. 14, latent images formed on the color-imaging photosensitive paper 42 by exposure to the reflected radiations from the wavelength converter device 48 are developed by the pressure rollers 20. The color filter device 46 may be eliminated if the wavelength converter device 48 is constituted by a member which is made of a mixture of the fluorescent materials used to form the converter elements 48C, 48M and 48Y. In this case, the photosensitive paper 42 may be exposed to the radiations of the three different wavelengths $\lambda C$, $\lambda M$ and $\lambda Y$, at one time.

Figure 18:
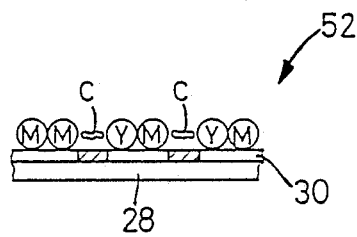
FIGS. 18 through 20 are views illustrating three states of color developments on a negative type of photosensitive paper.
Figure 19:
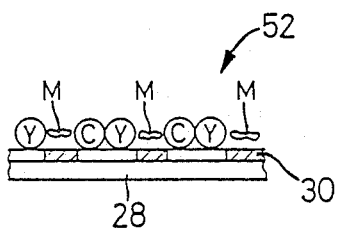
Figure 20:
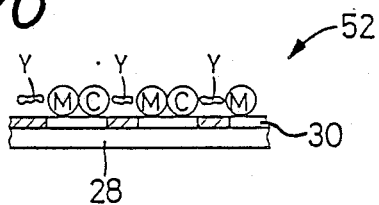
Figure 17:
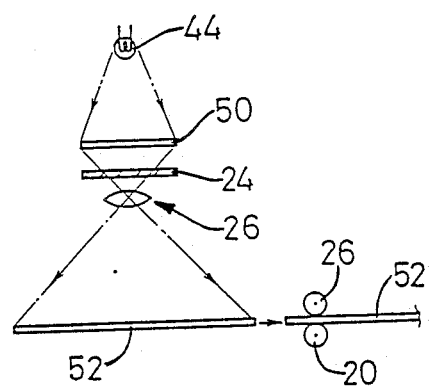
FIG. 17 is a schematic view showing a further embodiment of the invention adapted for color imaging on a negative type photosensitive paper.

In the above-illustrated embodiments, except the embodiments of FIGS. 3 and 4, the photosensitive paper 16 or 42 is exposed to lights which have been reflected by the original 14. It is possible that images may be transferred to a photosensitive paper, by exposing the paper to lights which have been transmitted through a transparent original having the images. An example of this arrangement is illustrated in FIG. 17, wherein a negative color film 50 obtained in an ordinary color photography is used as an original having negative color images. These negative images are converted into positive color images. Described in greater detail, the radiation emitted by the light source lamp 44 is transmitted through the negative color film 50, and through the wavelength converting filter 24. The radiation whose wavelength is shortened by the filter 24 is focused on a negative type color-imaging photosensitive paper 52. This negative type photosensitive paper 52 is constructed similarly to the positive type photosensitive paper 42 of FIG. 10, except that the microcapsules C, M and Y contain photosensitive resins which are softened upon exposure to radiations having the wavelengths $\lambda C$, $\lambda M$ and $\lambda Y$. Such radiation-softened resin may be made of 3-oximino-2-butanone methacrylate which undergoes main chain scission upon light exposure, or poly 4'-alkyl acylo-phenones. In the present embodiment, when the negative type photosensitive paper 52 is exposed to the red-band radiation having the wavelength $\lambda C$ from the converting filter 24, only the microcapsules C in the exposed area of the paper 52 are ruptured, as indicated in FIG. 18, producing a cyan color which is complementary to a red color. When the paper 52 is exposed to the green-band radiation having the wavelength $\lambda M$, only the microcapsules M in the exposed area are ruptured, as indicated in FIG. 19, producing a magenta color which is complementary to a green color. Likewise, only the microcapsules Y are ruptured as indicated in FIG. 10, producing a yellow color which is complementary to a blue color.

As described above, latent images formed on the negative type color-imaging photosensitive paper 52 through the focusing device 26 are developed such that the colors of the developed visible images are complementary to the colors of the images on the negative color film 50. Thus, positive color images of the negative color images on the negative color filter 50 are formed on the negative type photosensitive paper 52. Namely, the visible images developed on the photosensitive paper 52 are reversed with respect to the negative color images on the negative color film 50.

Figure 21:
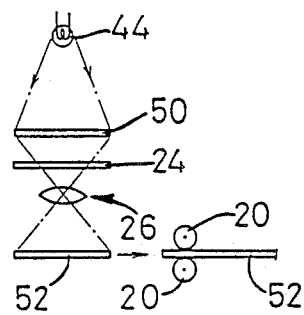
FIG. 21 is a schematic view of a still further embodiment of the invention adapted for color imaging on a negative type photosensitive paper.
Figure 22:
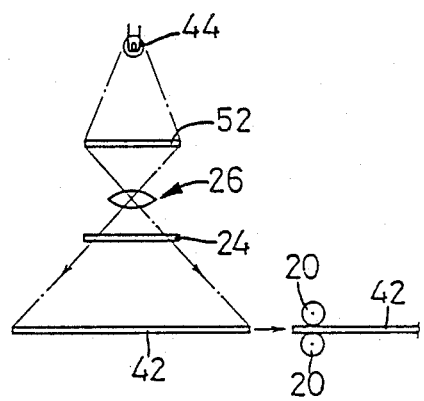
FIG. 22 is a view illustrating an image transfer system for transferring positive color images from the photosensitive paper of FIG. 21 to a positive type color-imaging photosensitive paper.

The negative color images on the negative color film 50 may be transferred to the positive type color-imaging photosensitive paper 42 of FIG. 10. In this instance, the negative color images on the negative color film 50 are first converted into positive color images on a negative type photosensitive paper 52, as indicated in FIG. 21, in the same manner as described in connection with the embodiment of FIG. 17. Then, the positive color images on the photosensitive paper 52 are transferred to a positive type photosensitive paper 42, as shown in FIG. 22. In the present embodiment, a transparent or translucent support is used to support the negative color-imaging photosensitive paper 52, since the paper 52 is used as a second original through which the radiation from the light source 44 is transmitted, as indicated in FIG. 22.

Figure 23:
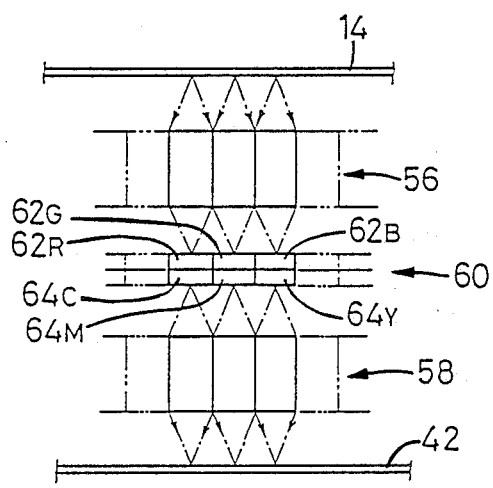
FIG. 23 is a view depicting a yet further embodiment of an image transfer system using self-focusing lenses.

While the various embodiments of the image transfer system of the invention which have been described and illustrated employs the optical focusing device 26 which has a convex lens for focusing the incident radiation on the photosensitive paper 16, 42, 52, it is possible to use other types of optical focusing device. An example of a modified focusing system is illustrated in FIG. 23. In the figure, the original 14 is supported on a glass plate not shown, and the positive type color-imaging photosensitive paper 42 is supported in parallel with the original 14, and is fed by feed rollers while being exposed. Below the original 14, there is provided a first array of self-focusing lenses 56, in the form of a multiplicity of cylindrical self-focusing fibers which are regularly arranged such that their centerlines are spaced apart from each other in the direction parallel to the surface of the original 14, and such that the corresponding end faces of the fibers lie in the same plane parallel to the original 14. Above the photosensitive paper 42, there is provided a second array of self-focusing lenses 58 which are regularly arranged along the surface of the paper 42, in radial alignment with the corresponding self-focusing lenses 56 of the first array. The corresponding ends of the self-focusing fibers of the second self-focusing lens array 58 lie in a plane parallel to the plane of the first array 56. These two self-focusing lens arrays 56, 58 have the same focal length, and are spaced from the original 14 and the photosensitive paper 42, respectively, by a distance substantially twice as large as the focal length. A wavelength converter 60 is positioned between the first and second self-focusing lens arrays 56, 58, such that the size of the images on the original 14 is the same as that of the images formed on the photosensitive paper 42.

The wavelength converter 60 consists of multiple sets of complementary-color filters 62, and corresponding multiple sets of fluorescent elements 64. These sets of filters 62 and fluorescent elements 64 are arranged parallel to the first and second self-focusing lens arrays 56, 58. Each set of the complementary-color filters 62 consists of a red-color filter 62R which permits transmission of the red-band radiation, a green-color filter 62G which permits transmission of the green-band radiation, and a blue-color filter 62B which permits transmission of the blue-band radiation. These complementary-color filters 62R, 62G and 62B in each set are arranged in the predetermined order in alignment with the self-focusing lenses 56. Each set of the fluorescent elements 64 consists of a first, a second and a third fluorescent element 64C, 64M and 64Y, which are arranged so that these elements are struck or energized by the radiations that have been passed through the corresponding filters 62R, 62G and 62B. The fluorescent elements 64C, 64M and 64Y emit radiations having different wavelengths $\lambda C$, $\lambda M$ and $\lambda Y$ which are shorter than the wavelengths of the incident radiations from the filters 62R, 62G and 62B.

In the present embodiment, the radiations that have been reflected by or transmitted through the original 14 are incident upon the wavelength converter 60 via the first self-focusing lens array 56. The radiations having the shortened wavelengths from the converter 60 are converged on the photosensitive paper 42, by the second self-focusing lens array 58. Thus, latent images corresponding to the images on the original 14 are formed on the photosensitive paper 42, and the latent images are developed by pressure rollers not shown. The wavelength converter 60 may be replaced by an SHD crystal indicated above.

Figure 24:
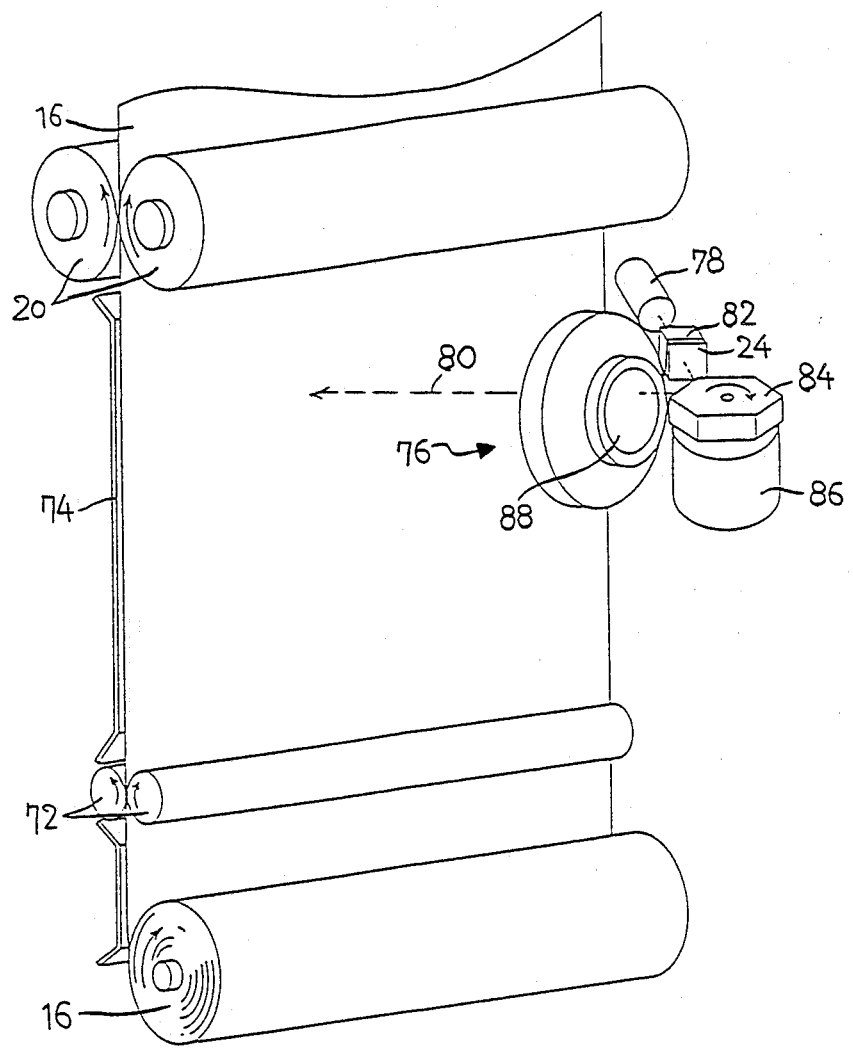
FIG. 24 is a view showing yet another embodiment of the invention in the form of a laser printer.

The principle of the present invention may be embodied as a laser printer as depicted in FIG. 24, wherein the photosensitive paper 16 is wound in a roll, and is advanced along a guide 74 by feed rollers 72, so that the paper 16 is exposed to a laser 80 emitted by a laser generator 76. The exposed photosensitive paper 16 is developed by the pressure rollers 20. The laser generator 76 includes: a semiconductor laser source 78 generating the laser 80; a modulator 82 for modulating the laser 80 according to image signals; a wavelength converting filter 24 for changing the wavelength of the laser 80 from the modulator 82; a polygon mirror 84 for deflecting the laser 80 over a certain angular range in a direction of width of the paper 16; a drive motor 86 for rotating the polygon mirror 84; and an f-$\theta$ lens 88 for adjusting the focal point of the laser 80, according to a variation in the length of the light path between the laser generator 76 and the surface of the paper 16. In this arrangement, latent images represented by the image signals indicative of characters, symbols, graphical representations and other images are formed on the photosensitive paper 16 upon exposure to the laser 80. The latent images are developed into visible images when the photosensitive paper 16 is passed through the pressure nip of the pressure rollers 20.

Since the laser 80 generated by the semiconductor laser source 78 has a wavelength that usually falls within a range between 760 nm and 780 nm, the wavelength converting filter 24 is provided to shorten the wavelength of the laser 80 as generated by the source 78, to a level to which the photosensitive paper 16 is sensitive. Thus, the converting filter 24 has the same advantages in the present laser printer, as in the image transfer systems which have been discussed above . . .

While the present invention has been described in its preferred embodiments, it is to be understood that the invention may be otherwise embodied.

For example, the image transfer system according to the invention may use a photosensitive medium, other than the photosensitive papers 16, 42, 52 used in the illustrated embodiments, which use a photosensitive resin.

Further, the light source lamp 22, 44 and the original 14 may be replaced by a CRT (cathode ray tube) or a liquid crystal plate.

It will be obvious that various optical components may be provided as needed, in the light path of the illustrated image transfer systems.

It is to be understood that the preferred embodiments have been described and shown for illustrative purpose only, and that various other changes and modifications may be made in the invention, without departing from the spirit of the present invention defined in the following claims.

What is claimed is:

1. An image transfer system wherein images are transferred from an original to a color-imaging photosensitive medium, said original and said photosensitive medium being disposed parallel to each other, said image transfer system comprising:

a first self-focusing lens array disposed between said original and said color-imaging photosensitive medium, said first self-focusing lens array consisting of a multiplicity of self-focusing fibers which are arranged in a first plane parallel to said original, said first self-focusing lens array receiving from said original a radiation having a first wavelength;

a second self-focusing lens array disposed between said first self-focusing lens array and said photosensitive medium, said second self-focusing lens array consisting of a multiplicity of self-focusing fibers which are arranged in a second plane parallel to said photosensitive medium; and a wavelength converter disposed between said first and second self-focusing lens arrays, said wavelength converter comprising a multiplicity of filters aligned with said multiplicity of self-focusing optical fibers of said first and second self-focusing lens arrays, respectively, and a multiplicity of fluorescent elements aligned with said multiplicity of filters, respectively, said wavelength converter converting said first wavelength of the radiation received from said first self-focusing lens array, to a second wavelength which is shorter than said first wavelength and to which said color-imaging photosensitive medium is sensitive.

2. An image transfer system wherein images are transferred to a photosensitive medium, comprising:

a photosensitive paper comprising a substrate, and a layer of microcapsules whose mechanical strength varies according to an amount of exposure thereof to a radiation, each of said microcapsules including a chromogenic material capable of reacting with a developing material to form an image;

a semiconductor laser source for generating an infrared laser radiation;

modulator means for modulating said infrared laser radiation according to image signals representative of said images;

a deflector spaced apart from said photosensitive paper;

a wavelength converter disposed in a light path defined between said semiconductor laser source and said deflector, for converting the modulated infrared laser radiation to an ultraviolet radiation which represents said images and to which said microcapsules of said photosensitive paper are sensitive, said wavelength converter consisting of a second harmonic generating crystal plate which permits said infrared laser radiation as an incident radiation, to be transmitted therethrough, and thereby provides a second harmonic of said incident radiation;

said deflector deflecting said ultraviolet radiation over a predetermined angular range to expose said layer of microcapsules of said photosensitive paper to said ultraviolet radiation representative of said images; and a developing device including a pair of pressure rollers which define a pressure nip therebetween through which said photosensitive medium is passed after said layer of microcapsules is exposed to said ultraviolet radiation, whereby pressure is applied to the exposed layer of microcapsules, to rupture said microcapsules according to an amount of exposure thereof to said ultraviolet radiation.

3. An image transfer system according to claim 2, wherein said photosensitive paper further comprises a developer layer having said developing material.

4. An image transfer system according to claim 2, wherein each said microcapsule of said layer of microcapsules of said photosensitive paper further includes a photosensitive resin which is cured by polymerization upon exposure to said ultraviolet radiation.

5. An image transfer system according to claim 2, wherein said second harmonic generating crystal plate is formed of a material which is selected from the group consisting of $KH_2PO_4(KDP)$, $NH_4H_2PO_4$, $KD_2PO_4$, $ND_4D_2PO_4$, $KH_2AsO_4$, $LiIO_3$, and $LiCLO_4.3H_2O$.

6. An image transfer system for transferring images to a photosensitive medium, comprising:

a photosensitive paper comprising a substrate, and a layer of microcapsules whose mechanical strength varies according to an amount of exposure thereof to a radiation, each of said microcapsules including a chromogenic material capable of reacting with a developing material to form an image;

a laser source for generating a laser radiation having a first wavelength;

modulator means for modulating said laser radiation according to image signals representative of said images;

a deflector spaced apart from said photosensitive paper;

a wavelength converter disposed in a light path defined between said laser source and said deflector, for converting the modulated laser radiation to a radiation having a second wavelength which is shorter than said first wavelength and to which said microcapsules of said photosensitive medium are sensitive, said radiation having said second wavelength being representative of said images, said wavelength converter consisting of a second harmonic generating crystal plate which permits said laser radiation having said first wavelength as an incident radiation, to be transmitted therethrough, and thereby provides a second harmonic of said incident radiation;

said deflector deflecting said radiation having said second wavelength over a predetermined angular range, to expose said layer of microcapsules of said photosensitive medium to said radiation having said second wavelength and representative of said images; and a developing device including a pair of pressure rollers which define a pressure nip therebetween through which said photosensitive medium is passed after said layer of microcapsules is exposed to said radiation having said second wavelength, whereby pressure is applied to the exposed layer of microcapsules, to rupture said microcapsules according to an amount of exposure thereof to said radiation having said second wavelength.

7. An image transfer system according to claim 6, wherein said second harmonic generating crystal plate is formed of a material which is selected from the group consisting of $KH_2PO_4(KDP)$, $NH_4H_2PO_4$, $KD_2PO_4$, $ND_4D_2PO_4$, $KH_2AsO_4$, $LiIO_3$, and $LiCLO_4.3H_2O$.

8. An image transfer system according to claim 6, wherein said first wavelength of said laser radiation falls within a range of 760–780 nm, and said radiation having said second wavelength is ultraviolet radiation.

9. An image transfer system according to claim 6, wherein said photosensitive paper further comprises a developer layer having said developing material.

10. An image transfer system according to claim 6, wherein each said microcapsule of said layer of microcapsules of said photosensitive paper further includes a photosensitive resin which is cured by polymerization upon exposure to said radiation having said second wavelength.

* * * * *